(12) United States Patent
Dong

(10) Patent No.: US 10,319,264 B2
(45) Date of Patent: Jun. 11, 2019

(54) AUXILIARY APPARATUS FOR UNFOLDING AND FOLDING FLEXIBLE DISPLAY PANEL AND FLEXIBLE DISPLAY DEVICE

(71) Applicant: BOE TECHNOLOGY GROUP CO., LTD., Beijing (CN)

(72) Inventor: Tian Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/511,131

(22) PCT Filed: Apr. 29, 2016

(86) PCT No.: PCT/CN2016/080583
§ 371 (c)(1),
(2) Date: Mar. 14, 2017

(87) PCT Pub. No.: WO2016/184303
PCT Pub. Date: Nov. 24, 2016

(65) Prior Publication Data
US 2018/0068594 A1    Mar. 8, 2018

(30) Foreign Application Priority Data

May 21, 2015    (CN) .......................... 2015 1 0262668

(51) Int. Cl.
*E05F 1/10*    (2006.01)
*G06F 1/16*    (2006.01)
(Continued)

(52) U.S. Cl.
CPC ............ *G09F 9/301* (2013.01); *G06F 1/1616* (2013.01); *G06F 1/1641* (2013.01);
(Continued)

(58) Field of Classification Search
CPC ...... G09F 9/301; G06F 1/1616; G06F 1/1641; G06F 1/1652; H01L 27/3237;
(Continued)

(56) References Cited

U.S. PATENT DOCUMENTS

2005/0184662 A1*  8/2005  Cok ................... H01L 51/5243
                                                              313/512
2012/0002360 A1   1/2012  Seo et al.
(Continued)

FOREIGN PATENT DOCUMENTS

| CN | 1247618 A | 3/2000 |
|---|---|---|
| CN | 103926979 A | 7/2014 |
| CN | 103927940 A | 7/2014 |
| CN | 104821138 A | 8/2015 |
| KR | 20140077807 A | 6/2014 |

OTHER PUBLICATIONS

First Office Action for Chinese Application No. 201510262668.8, dated Sep. 1, 2016, 8 Pages.
(Continued)

*Primary Examiner* — Michael P McFadden
(74) *Attorney, Agent, or Firm* — Brooks Kushman P.C.

(57) ABSTRACT

A flexible display device having an auxiliary apparatus for unfolding and folding a flexible display panel. The auxiliary apparatus for unfolding and folding a flexible display panel includes a support plate structure configured to be fixedly attached to the flexible display panel and having a first state and a second state, wherein the support plate structure is configured to assist in the first state the flexible display panel to be in a folded state, and assist in the second state the flexible display panel to be in an unfolded state, and a locking mechanism configured to lock the support plate structure in the first state.

14 Claims, 4 Drawing Sheets

(51) Int. Cl.
  *G09F 9/30* (2006.01)
  *H04M 1/02* (2006.01)
  *H05K 1/02* (2006.01)
  *H01L 27/32* (2006.01)

(52) U.S. Cl.
  CPC .......... *G06F 1/1652* (2013.01); *G06F 1/1679* (2013.01); *G06F 1/1681* (2013.01); *H01L 27/3237* (2013.01); *H04M 1/0268* (2013.01); *H05K 1/028* (2013.01); *E05F 1/1016* (2013.01); *H01L 2251/5338* (2013.01); *H05K 2201/10128* (2013.01)

(58) Field of Classification Search
  CPC ......... H01L 2251/5338; H04M 1/0268; H05K 1/028; H05K 2201/10128; E05F 1/1016
  USPC ........................................................ 361/749
  See application file for complete search history.

(56) References Cited

U.S. PATENT DOCUMENTS

| | | | |
|---|---|---|---|
| 2013/0342090 A1* | 12/2013 | Ahn | G09F 9/33 312/258 |
| 2014/0196253 A1 | 7/2014 | Song et al. | |
| 2014/0196254 A1 | 7/2014 | Song | |
| 2016/0299539 A1* | 10/2016 | Jang | G06F 1/1681 |
| 2016/0302316 A1* | 10/2016 | Jeong | G05B 11/01 |

OTHER PUBLICATIONS

Second Office Action for Chinese Application No. 201510262668.8, dated Mar. 22, 2017, 3 Pages.
International Search Report and Written Opinion for Application No. PCT/CN2016/080583, dated Jul. 22, 2016, 14 Pages.

* cited by examiner

AUXILIARY APPARATUS FOR UNFOLDING AND FOLDING FLEXIBLE DISPLAY PANEL AND FLEXIBLE DISPLAY DEVICE

CROSS-REFERENCE TO RELATED APPLICATIONS

This application is the U.S. national phase of PCT Application No. PCT/CN2016/080583 filed on Apr. 29, 2016, which claims priority to Chinese Patent Application No. 201510262668.8 filed on May 21, 2015, the disclosures of which are incorporated in their entirety by reference herein.

TECHNICAL FIELD

The present disclosure relates to the field of display technology, and in particular to an auxiliary apparatus for unfolding and folding a flexible display panel and a flexible display device.

BACKGROUND

A flexible display panel has become an important direction of development of display screens for electronic devices, due to advantages of bendability and portability thereof. The flexible display panel may be a monolithic display screen or a display screen formed by joining multiple smaller screens, and is bendable. Currently, the flexible display panel is manually unfolded, and if the flexible display panel is in a folded state, there is a hidden problem that the flexible display panel may be mistakenly unfolded and thus damaged.

SUMMARY

In view of the above, the present disclosure provides a flexible display device having an auxiliary apparatus for unfolding and folding a flexible display panel, so that the flexible display panel may be prevented from being unfolded by unexpected exterior forces and being damaged.

Directing to the above objectives, the present disclosure provides an auxiliary apparatus for unfolding and folding a flexible display panel. The auxiliary apparatus for unfolding and folding a flexible display panel includes: a support plate structure configured to be fixedly attached to the flexible display panel and having a first state and a second state, and a locking mechanism configured to lock the support plate structure to be in the first state. The support plate structure is configured to assist in the first state the flexible display panel to be in a folded state, and assist in the second state the flexible display panel to be in an unfolded state.

Optionally, the support plate structure includes two rigid plates, and when the flexible display panel is in the folded state, the two rigid plates are positioned on two folding surfaces of the flexible display panel respectively, at least one of the two rigid plates includes an extension portion located on a side surface of the rigid plate, and the side surface is adjacent to a bending portion of the flexible display panel when the flexible display panel is in the folded state, and the locking mechanism is configured to abut against the extension portion when the flexible display panel is in the folded state, such that the support plate structure is locked in the first state.

Optionally, the support plate structure includes one rigid plate, and when the flexible display panel is in the folded state, the rigid plate is positioned on a folding surface of the flexible display panel, the rigid plate includes an extension portion located on a side surface of the rigid plate, and the side surface is adjacent to a bending portion of the flexible display panel when the flexible display panel is in the folded state, and the locking mechanism is configured to abut against the extension portion when the flexible display panel is in the folded state, such that the support plate structure is locked in the first state.

Optionally, the locking mechanism is an elastic retractable locking mechanism.

Optionally, the elastic retractable locking mechanism includes an electromagnet and a spring; the electromagnet is configured to attract the spring to be in a compressed state when the electromagnet is energized, and release the spring to be in an extended state when the electromagnet is not energized.

Optionally, the elastic retractable locking mechanism includes an inflation-deflation member and a gas column. The gas column is in an inflated state when the flexible display device is in the folded state, and in a deflated state when the flexible display device is in the unfolded state.

Optionally, the support plate structure further includes a bendable backplate arranged between the rigid plates and the flexible display panel and fixedly attached onto a whole back surface of the flexible display panel.

Optionally, the bendable backplate is an elastic backplate and is in an elastic compressed state when the flexible display panel is folded, and the flexible display panel is spread as the elastic backplate changes from the elastic compressed state to a spread state when the locking mechanism is unlocked.

Optionally, the elastic backplate is made of memory metal, and the spread state of the elastic backplate is an initial state of the memory metal.

Optionally, the elastic backplate may be a bendable metal slice.

Optionally, the support plate structure includes two rigid plates, two extension portions are arranged on side surfaces of the two rigid plates located at edges of the flexible display panel, respectively, and the locking mechanism clamps the two extension portions.

Optionally, the locking mechanism is U-shaped.

Optionally, the rigid plate includes an extension portion located on a side surface, the side surface is adjacent to a bending portion when the flexible display panel is in the folded state, and the locking mechanism is rotatably installed on the extension portion by a pivot.

Optionally, the locking mechanism includes an electromagnet and a spring. The electromagnet is rotatably installed on the extension portion by the pivot, the spring includes a first part and a second part, and the first part of the spring is set around and fixed onto the electromagnet.

Optionally, the locking mechanism further includes an attracting pad that is magnetically attractable and arranged on the second part of the spring.

Optionally, the locking mechanism includes an inflation-deflation member and a gas column. The inflation-deflation member is rotatably installed on the extension portion by the pivot, and the gas column is arranged at a free end of the inflation-deflation member and is configured to be inflated or deflated by the inflation-deflation member.

Further, the present disclosure provides a flexible display device. The flexible display device includes the auxiliary apparatus for unfolding and folding a flexible display panel provided in any embodiment of the present disclosure.

It may be seen from above that, in the auxiliary apparatus for unfolding and folding a flexible display panel and a flexible display device provided in the present disclosure, the flexible display panel is in the folded state when the support plate structure is in the first state, and is in the unfolded state when the support plate structure is in the second state, the locking mechanism therein may lock the support plate structure in the first state, so that the flexible display panel may not be unfolded by unexpected exterior forces and further may not be damaged due to unexpected unfolding. On the other hand, when the locking mechanism in the auxiliary apparatus for unfolding and folding a flexible display panel provided by embodiments of the present disclosure is unlocked, the elastic backplate of the support plate structure may be elastically spread to restore the spread state, so that the flexible display panel attached with the elastic backplate is in the unfolded and spread state, thereby assisting in unfolding the flexible display panel.

DETAILED DESCRIPTION

To make technical problems to be solved, technical solutions, and advantages of the present disclosure more clear, specific embodiments will be described hereinafter in detail in conjunction with the drawings.

Figure 1A:
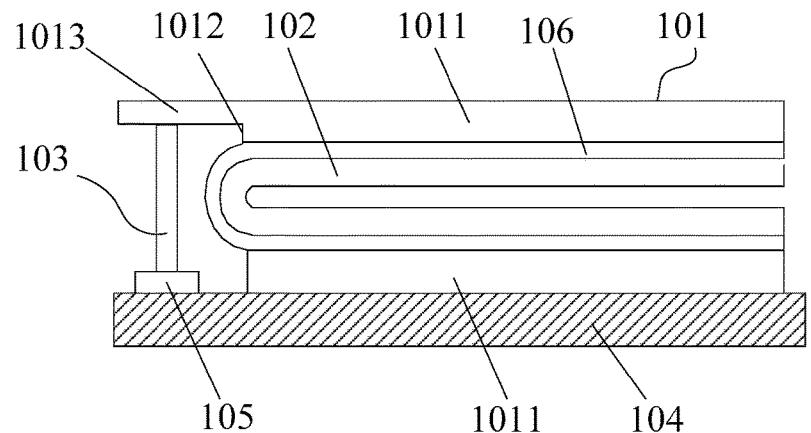
FIG. 1A is a schematic diagram of a folded state of an auxiliary apparatus for unfolding and folding a flexible display panel in at least some embodiments of the present disclosure.
Figure 1B:
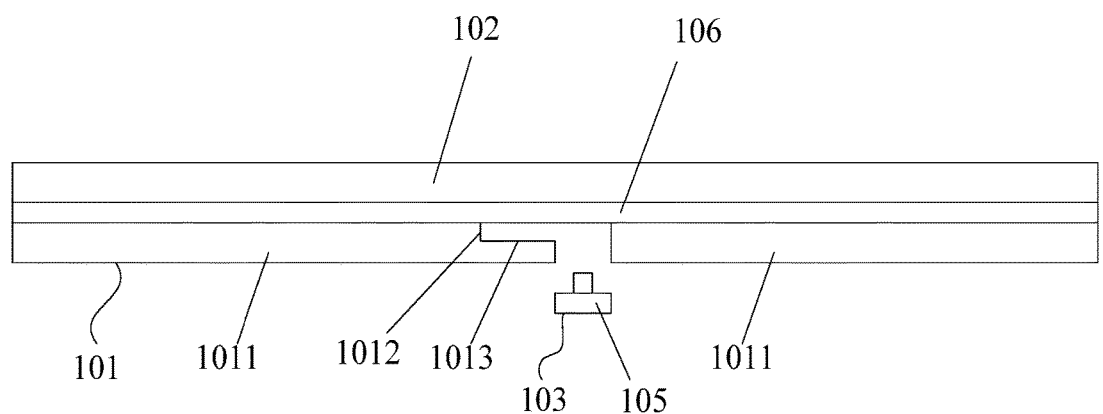
FIG. 1B is a schematic diagram of an unfolded state of an auxiliary apparatus for unfolding and folding a flexible display panel in at least some embodiments of the present disclosure.

In a first aspect, the present disclosure provides an auxiliary apparatus for unfolding and folding a flexible display panel. As shown in FIGS. 1A and 1B, the auxiliary apparatus includes a support plate structure 101 and a locking mechanism 103. The support plate structure 101 is configured to be fixedly attached to the flexible display panel 102 and has a first state as shown in FIG. 1A and a second state as shown in FIG. 1B. When the support plate structure 101 is in the first state, the support plate structure 101 may assist the flexible display panel 102 to be in a folded state; and when the support plate structure 101 is in the second state, the support plate structure 101 may assist the flexible display panel 102 to be in an unfolded state.

The locking mechanism 103 is configured to lock the support plate structure 101 in the first state.

It may be seen from the above that the auxiliary apparatus for unfolding and folding a flexible display panel provided by the present disclosure may lock the flexible display panel in the folded state when the flexible display panel is in the folded state. Only when the locking mechanism is artificially unlocked, the flexible display panel may be unfolded, thereby preventing the flexible display panel from being unfolded mistakenly when the flexible display panel is in the folded state and a display screen having the flexible display panel is in a locked state. Thus, the flexible display panel cannot be unfolded by accident and the problem of damaging accidently a display surface of the flexible display panel due to unfolding may be solved.

In specific embodiments of the present application, the folded state may be a folded state as shown in FIG. 1A, or a state in which the flexible display panel is folded along any preset folding line. The flexible display panel 102 may be a monolithic bendable and foldable flexible display panel, such as a Organic Light-Emitting Diode (OLED) screen that may be curled.

Still referring to FIGS. 1A and 1B, in some embodiments of the present disclosure, the support plate structure 101 includes a rigid plate 1011. When the flexible display panel 102 is in the folded state, the rigid plate 1011 is on one of the folding surfaces of the flexible display panel 102. The rigid plate 1011 includes an extension portion 1013 located on a side surface 1012 of the rigid plate 1011, and the side surface 1012 is one side surface of the rigid plate 1011 adjacent to a bending portion of the flexible display panel 102 when the flexible display panel 102 is in the folded state, the locking mechanism 103 is used to abut against the extension portion 1013 when the flexible display panel is in the folded state, such that the support plate structure 101 is locked in the first state.

The folding surfaces are surface of the flexible display panel partitioned by one or more folding lines on the flexible display panel. In the embodiments shown in FIGS. 1A, 1B, and 2, the flexible display panel 102 includes at least two folding surfaces. The rigid plate is fixed attached to the flexible display panel 102, and may protect the flexible display panel when the flexible display panel 102 is folded, and may support and protect the flexible display panel when the flexible display panel 102 is unfolded. If the flexible display panel 102 is a flexible display panel which is bendable and foldable, the rigid plate may also function to spread the flexible display panel 102.

It should be understood that, in the embodiments shown in FIGS. 1A and 1B, a bearing device such as a table may be used when implementing the function of the auxiliary apparatus for folding and unfolding a flexible display panel. The bearing device is used to bear the flexible display panel and the locking mechanism 103. If the flexible display panel need to be folded and locked in the folded state, the flexible display panel in the folded state may be placed onto a bearing platform 104 of the bearing device, and the locking mechanism 103 is positioned on or near the bearing platform, so that the locking mechanism 103 may press against and support the extension portion 1013 of the rigid plate 1011, and the relative positions of the rigid plate 1011 and the extension 1013 are fixed, thus preventing the flexible display panel 102 from being unfolded by an unexpected exterior force when the unexpected exterior force is applied onto the flexible display panel 102.

The unfolded state discussed in the above embodiments includes a spread state when the flexible display panel 102 is completely spread, as shown in FIG. 1B. The unfolded state further includes an intermediate state between the spread state shown in FIG. 1B and the folded state shown in FIG. 1A, e.g., a state in which an angle between the two folding surfaces of the flexible display panel 102 is greater than 0 degree and less than 180 degrees.

In at least some embodiments of the present disclosure, still referring to FIGS. 1A and 1B, the support plate structure 102 includes two rigid plates 1011. When the flexible display panel 102 is in the folded state, the two rigid plates 1011 are located on the two folding surfaces 1021 of the flexible display panel respectively. At least one of the two rigid plates 1011 includes an extension portion 1013 on a side surface 1012. In the embodiments shown in FIGS. 1A and 1B, only one of the two rigid plates 1011 includes the extension portion 1013 on the side surface 1012, and the other of the two rigid plates 1011 does not include an extension portion. The side surface 1012 is the side surface of the rigid plate 1011 adjacent to the bending portion of the flexible display panel 102 when the flexible display panel 102 is in the folded state. The locking mechanism 103 is used to abut against the extension portion 1013 when the flexible display panel is in the folded state, such that the support plate structure 101 is locked in the first state. In the embodiments shown in FIGS. 1A and 1B, the rigid plate 1011 with the extension portion 1013 is positioned above the flexible display panel 102 when the flexible display panel 102 is in the folded state, and the locking mechanism 103 bears the locking mechanism 1013 so that the flexible display panel 102 cannot be unfolded.

Figure 2:
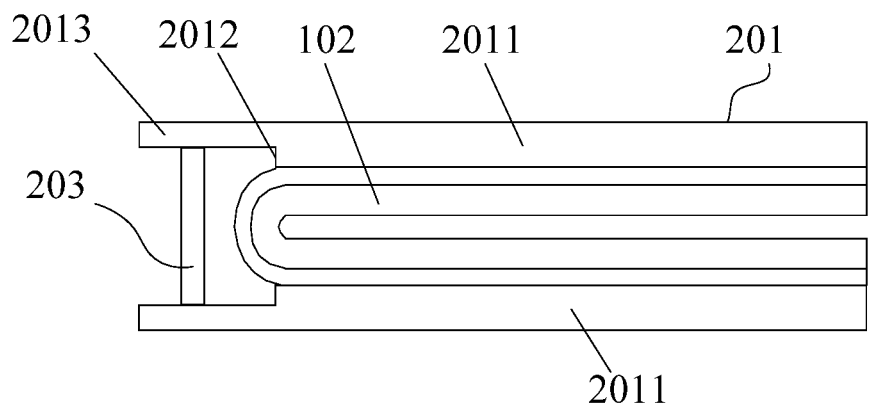
FIG. 2 is a schematic diagram of a folded state of an auxiliary apparatus for unfolding and folding a flexible display panel in at least some embodiments of the present disclosure.

In the embodiments shown in FIGS. 1A, 1B and 2, the flexible display panel is a single-fold flexible display panel, i.e., the flexible display panel may be folded only once. In other embodiments of the present disclosure, the flexible display panel may be a two-fold or multiple-fold flexible display panel, i.e., the flexible display panel may be folded twice or more times. If the flexible display panel is a two-fold or multiple-fold flexible display panel, the rigid plate with the extension portion may be positioned on two outermost folding surfaces of the flexible display panel when the flexible display panel is in the folded state.

Further, in optional embodiments, as shown in FIG. 2, if the support plate structure 201 includes two rigid plates 2011, each of which may include an extension portion 2013 on the side surface 2012. The side surface 2012 of each rigid plate 2011 is a side surface adjacent to a bending portion of the flexible display panel 102 when flexible display panel 102 is in the folded state. Thus, the locking mechanism 203 may bear the two rigid plates 2011 by being arranged between the two extension portions 2013, so that the support plate structure 201 is locked into the first state.

When the support plate structure includes two rigid plates, each of which has its corresponding extension portion, the locking mechanism may be fixed onto the extension portion of one of the two rigid plates. When the support plate structure includes one rigid plate having an extension portion, the locking mechanism may be independent from the support plate structure. The rigid plate(s) should be attached to a back side of the flexible display panel, so that a display surface of the flexible display panel may not be exposed in the folded state.

In some embodiments of the present disclosure, the locking mechanism is an elastic retractable locking mechanism, such as a spring and elastic rubber. In practice, a corresponding button for controlling extension and retraction of the elastic retractable locking mechanism may be arranged so that a user may control locking and unlocking of the folded state of the flexible display panel by the button. If the locking mechanism locks the flexible display panel in the folded state by abutting against the extension portion of the rigid plate, the locking mechanism may have a bar shape including a straight-bar shape or a bent-bar shape. If the support plate structure includes two rigid plates having respective extension portions, the bar-shaped locking mechanism is arranged between the extension portions of the two rigid plates when the flexible display panel needs to be locked in the folded state, so as to lock the flexible display panel in the folded state; and if the support plate structure includes one rigid plate having a respective extension portion, the bar-shaped locking mechanism is arranged between the extension portion of the rigid plate and the bearing platform of the bearing device when the flexible display panel needs to be locked in the folded state, so as to lock the flexible display panel in the folded state.

Still referring to FIGS. 1A and 1B, when the locking mechanism 103 substantially has a bar shape, the auxiliary apparatus for unfolding and folding the flexible display panel further includes a base 105 which is used to support the bar-shaped locking mechanism 103, so that the locking mechanism 103 is more stable. Meanwhile, elements for controlling the locking or the unlocking of the locking mechanism 103, such as buttons or power sources, may also be arranged on the base 105.

Figure 3:
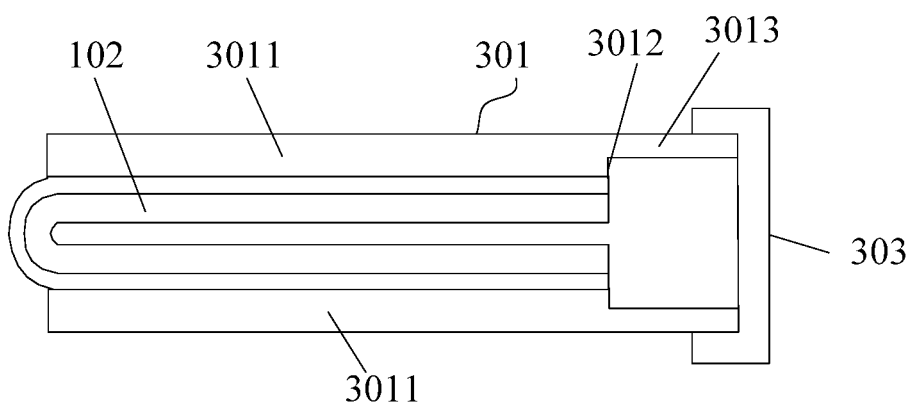
FIG. 3 is a schematic structural diagram of an auxiliary apparatus for unfolding and folding a flexible display panel in at least some embodiments of the present disclosure.

In some other embodiments of the present disclosure, the locking mechanism may be a non-elastic mechanism such as a clamping mechanism. Accordingly, the support platform structure should be adapted to the clamping structure. As shown in FIG. 3, the support plate structure 301 includes two rigid plates 3011, and an extension portion 3013 is arranged on a side surface 3012 of each rigid plate 3011 adjacent to an edge of the flexible display panel, and a locking mechanism capable of clamping the two extension portions 3013 clamps the extension portions 3013 and locks the support plate structure 301 in the first state, so that the flexible display panel 102 is locked in the folded state.

Figure 4:
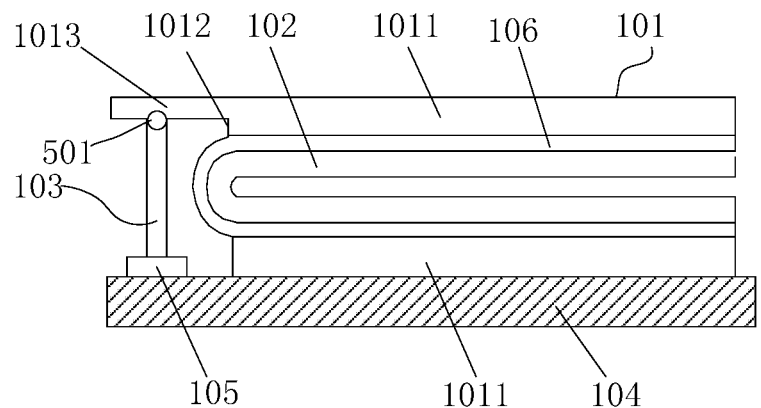
FIG. 4 is a schematic diagram of a folded state of an auxiliary apparatus for unfolding and folding a flexible display panel in at least some embodiments of the present disclosure.

In some embodiments of the present disclosure, as shown in FIG. 4, the locking mechanism 103 may be rotatably installed on the extension portion 1013 by a pivot 501 such as a shaft. In this way, a position of the locking mechanism 103 relative to the extension portion 1013 may be conveniently adjusted. For example, the locking mechanism 103 may be rotated relative to the extension portion 1013 around the pivot 501 to a position substantially perpendicular to the extension portion 1013. At this position, as shown in FIG. 4, the locking mechanism 103 is sandwiched between the extension portion 1013 and the bearing platform 104, thereby locking the support plate structure 101 in the first state and locking the flexible display panel in the folded state.

Figure 5:
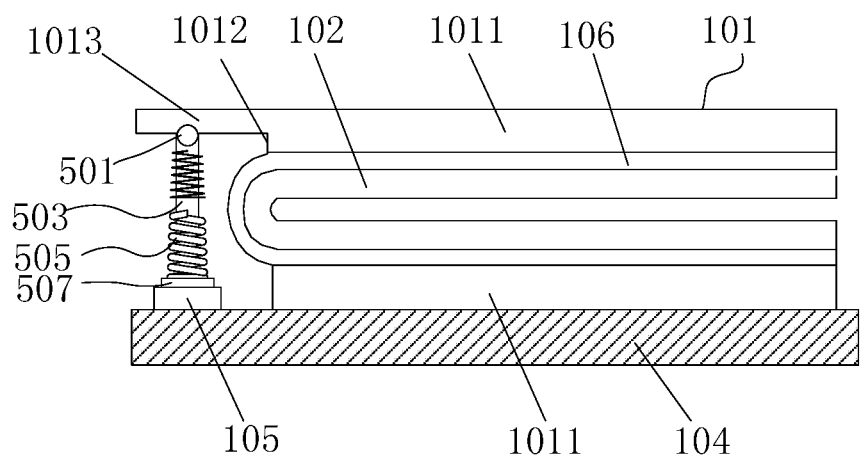
FIG. 5 is a schematic diagram of a folded state of an auxiliary apparatus for unfolding and folding a flexible display panel in at least some embodiments of the present disclosure.

In some embodiments of the present disclosure, the elastic retractable locking mechanism includes an electromagnet and a spring. The electromagnet is used to attract the spring to be in a compressed state when the electromagnet is applied with electricity, and release the spring to be in an extended state when the electromagnet is not provided with electricity. In practice, a corresponding power source and corresponding switches are arranged to control ON/OFF states of the electromagnet. For example, as shown in FIG. 5, the locking mechanism may include an electromagnet 503 and a spring 505. The electromagnet 503 may be rotatably installed on the extension portion 1013 by the pivot 501 such as a shaft. The spring 505 is set around and fixed onto the electromagnet 503, and the electromagnet 503 divides the spring 505 into two parts, i.e., a first part with the electromagnet 503 arranged and a second part without the electromagnet 503 arranged. In other words, the first part of the spring 505 is set around and fixed onto the electromagnet 503, and the electromagnet 503 extends into the first part of the spring 505, but not into the second part of the spring 505.

The electromagnet generates a magnetic field when being provided with electricity and causes the spring 505 to be compressed, such as along an axial direction of the electromagnet 503 towards the extension portion 1013 and the pivot 501, such that the second portion of the spring 505 moves away from the bearing platform 104, thereby unfolding the flexible display panel 102. When the electromagnet is not provided with electricity, the magnetic field generated by the electromagnet disappears and the spring restores its initial state, such that the second part of the spring 505 moves towards the bearing platform 104 along the axial direction of the electromagnet to a state shown in FIG. 5, thereby locking the support plate structure 101 in the first state and the flexible display panel in the folded state.

Additionally, in order to enhance a force between the spring 505 and the electromagnet 503, an attracting pad 505 attractable by magnetic forces may be arranged at the second part of the spring 505. The attracting pad 507 may be formed of iron, magnet or the like. When the attracting pad 507 is used, the spring 505 may be formed of elastic material that is not attractable by magnetic forces.

Figure 6:
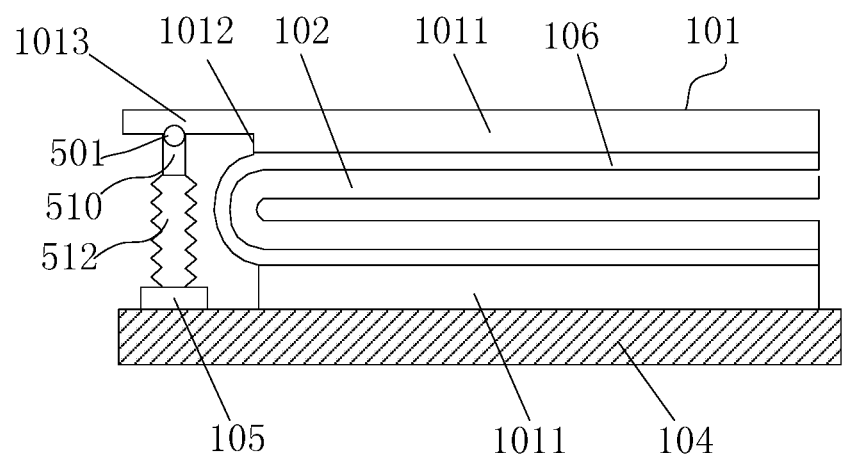
FIG. 6 is a schematic diagram of a folded state of an auxiliary apparatus for unfolding and folding a flexible display panel in at least some embodiments of the present disclosure.

In specific embodiments of the present application, the elastic retractable locking mechanism is an inflation mechanism. It should be understood that, when the elastic retractable locking mechanism is the inflation mechanism, the locking mechanism may also include a corresponding gas suction member which is controllable by corresponding buttons. For example, as shown in FIG. 6, the locking mechanism includes an inflation-deflation member 510 and a gas column 512. The inflation-deflation member 510 may be rotatably installed on the extension portion 1013 by a pivot 501 such as a shaft. The gas column is arranged at a free end of the inflation-deflation member 510 and may be inflated or deflated by the inflation-deflation member 510. In an inflated state, as shown in FIG. 6, the locking mechanism 103 is sandwiched between the extension portion 1013 and the bearing platform 104, thereby locking the support plate structure 101 in the first state and locking the flexible display panel in the folded state.

Those skilled in the art should understand that the locking mechanism may also be other non-elastic retractable locking mechanism.

In specific embodiments of the present disclosure, still referring to FIG. 1A, the support plate structure 101 further includes a bendable backplate 106 arranged between the rigid plate and the flexible display panel and fixedly attached onto the whole of a back surface of the flexible display panel 102.

In specific embodiments of the present disclosure, the bendable backplate 106 is an elastic backplate, which is in an elastic compressed state when the flexible display panel is folded, and the flexible display panel is spread as the elastic backplate changes from the elastic compressed state to a spread state when the locking mechanism is unlocked.

Further, the bendable backplate 106 is a flat plate if not being applied with exterior forces, and may be bent and folded if being applied with exterior forces.

In specific embodiments of the present disclosure, the elastic backplate is formed of memory metal. When the locking mechanism 103 locks the support plate structure 101 in the first state, the elastic backplate formed of memory metal is also locked in a deformed state, i.e., a folded state; and when the locking mechanism 103 is unlocked, the elastic backplate may be manually unfolded firstly, so that the flexible display panel is kept in a spread state, thereby implementing a function of assisting in unfolding and spreading the flexible display panel.

When the locking mechanism 103 is in a locked state, the support plate structure 101 is locked in the first state, and the elastic backplate formed of memory metal is in the deformed state; and when the locking mechanism is unlocked, the elastic backplate formed of memory metal spreads itself by inherent tensile forces, and restores its initial state, i.e., the spread state. The flexible display panel 102 is thus in the spread state.

When the flexible display panel 102 is required to change itself from the unfolded state to the locked state, the elastic backplate is manually folded firstly, so that the flexible display panel is in the folded state as the elastic backplate is being folded. Then, the locking mechanism 103 is operated to lock the support plate structure 101, so as to lock the flexible display panel in the folded state.

Further, a flexible display device is provided in the present disclosure, which includes the auxiliary apparatus for unfolding and folding a flexible display panel provided in any embodiment of the present disclosure.

The flexible display device is a display panel or a display device.

It may be seen from above that, in the auxiliary apparatus for unfolding and folding a flexible display panel and a flexible display device, the flexible display panel is in the folded state when the support plate structure is in the first state, and is in the unfolded state when the support plate structure is in the second state, the locking mechanism therein may lock the support plate structure in the first state, so that the flexible display panel may not be unfolded by unexpected exterior forces and further may not be damaged due to unexpected unfolding. On the other hand, when the locking mechanism in the auxiliary apparatus for unfolding and folding a flexible display panel provided by embodiments of the present disclosure is unlocked, the elastic backplate of the support plate structure may be elastically spread to restore the spread state, so that the flexible display panel attached with the elastic backplate is in the unfolded and spread state, thereby assisting in unfolding the flexible display panel.

It should be understood that the embodiments described in the present disclosure are only used to illustrate and explain the present disclosure, not to limit the present disclosure. The embodiments and features in the embodiments in the present disclosure may be combined on a non-conflict basis.

Apparently, those skilled in the art may modify and change the present disclosure without departing from spirits and scopes of the present disclosure. If such modification and changes to the present disclosure fall within the scope of claims of the present disclosure or equivalents thereof, it is intended that the modification and changes are included in the present disclosure.

What is claimed is:

1. An auxiliary apparatus for unfolding and folding a flexible display panel, comprising:
   a support plate structure configured to be fixedly attached to the flexible display panel and having a first state and a second state, wherein the support plate structure is configured to assist in the first state the flexible display panel to be in a folded state, and assist in the second state the flexible display panel to be in an unfolded state; and
   a locking mechanism configured to lock the support plate structure in the first state,
   wherein the support plate structure comprises one or two rigid plates, and in the event that the flexible display panel is in the folded state, the one or two rigid plates are positioned on one or two folding surfaces of the flexible display panel respectively, at least one of the rigid plates comprises an extension portion located on a side surface of the rigid plate, and the side surface is adjacent to a bending portion of the flexible display panel in the event that the flexible display panel is in the folded state, and the locking mechanism is configured to abut against the extension portion in the event that the flexible display panel is in the folded state, such that the support plate structure is locked in the first state;

wherein the locking mechanism is an elastic retractable locking mechanism;

wherein the auxiliary apparatus further comprises a base configured to support the locking mechanism, and the base is provided with a button or a power source switch configured to automatically control locking or unlocking of the locking mechanism.

2. The auxiliary apparatus according to claim 1, wherein the elastic retractable locking mechanism comprises an electromagnet and a spring, the electromagnet is configured to attract the spring to be in a compressed state in the event that the electromagnet is energized, and release the spring to be in an extended state in the event that the electromagnet is not energized.

3. The auxiliary apparatus according to claim 1, wherein the elastic retractable locking mechanism comprises an inflation-deflation member and a gas column, the gas column is in an inflated state in the event that the flexible display panel is in the folded state, and in a deflated state in the event that the flexible display panel is in the unfolded state.

4. The auxiliary apparatus according to claim 1, wherein the support plate structure further comprises a bendable backplate arranged between the two rigid plates and the flexible display panel and fixedly attached onto a whole back surface of the flexible display panel.

5. The auxiliary apparatus according to claim 4, wherein the bendable backplate is an elastic backplate and is in an elastic compressed state in the event that the flexible display panel is folded, and the flexible display panel is spread as the elastic backplate changes from the elastic compressed state to a spread state in the event that the locking mechanism is unlocked.

6. The auxiliary apparatus according to claim 5, wherein the elastic backplate is made of memory metal, and the spread state of the elastic backplate is an initial state of the memory metal.

7. The auxiliary apparatus according to claim 1, wherein the locking mechanism is rotatably installed on the extension portion by a pivot.

8. The auxiliary apparatus according to claim 7, wherein the locking mechanism comprises an electromagnet and a spring, the electromagnet is rotatably installed on the extension portion by the pivot, the spring comprises a first part and a second part, and the first part of the spring is set around and fixed onto the electromagnet.

9. The auxiliary apparatus according to claim 8, wherein the locking mechanism further comprises an attracting pad that is magnetically attractable and arranged on the second part of the spring.

10. The auxiliary apparatus according to claim 7, wherein the locking mechanism comprises an inflation-deflation member and a gas column, the inflation-deflation member is rotatably installed on the extension portion by the pivot, and the gas column is arranged at a free end of the inflation-deflation member and is configured to be inflated or deflated by the inflation-deflation member.

11. The auxiliary apparatus according to claim 1, wherein the button or the power source is configured to control the elastic retractable locking mechanism to be lengthen or shorten, so as to control locking or unlocking of the locking mechanism.

12. A flexible display device comprising a flexible display panel and an auxiliary apparatus for unfolding and folding a flexible display panel, wherein
the auxiliary apparatus comprises:
a support plate structure configured to be fixedly attached to the flexible display panel and having a first state and a second state, wherein the support plate structure is configured to assist in the first state the flexible display panel to be in a folded state, and assist in the second state the flexible display panel to be in an unfolded state; and
a locking mechanism configured to lock the support plate structure in the first state, and
the flexible display panel is attached to the auxiliary apparatus,
wherein the support plate structure comprises one or two rigid plates, and in the event that the flexible display panel is in the folded state, the one or two rigid plates are positioned on one or two folding surfaces of the flexible display panel respectively, at least one of the rigid plates comprises an extension portion located on a side surface of the rigid plate, and the side surface is adjacent to a bending portion of the flexible display panel in the event that the flexible display panel is in the folded state, and the locking mechanism is configured to abut against the extension portion in the event that the flexible display panel is in the folded state, such that the support plate structure is locked in the first state;
wherein the locking mechanism is an elastic retractable locking mechanism;
wherein the auxiliary apparatus further comprises a base configured to support the locking mechanism, and the base is provided with a button or a power source switch configured to control locking or unlocking of the locking mechanism.

13. An auxiliary apparatus for unfolding and folding a flexible display panel, comprising:
a support plate structure configured to be fixedly attached to the flexible display panel and having a first state and a second state, wherein the support plate structure is configured to assist in the first state the flexible display panel to be in a folded state, and assist in the second state the flexible display panel to be in an unfolded state; and
a locking mechanism configured to lock the support plate structure in the first state,
wherein the support plate structure comprises two rigid plates, two extension portions are provided on side surfaces of the two rigid plates located at edges of the flexible display panel, respectively, and the locking mechanism is configured to clamp the two extension portions,
wherein the flexible display panel in the folded state directly contacts internal surfaces of the two rigid plates of the support plate structure, and the locking mechanism clamps on two external surfaces of the two extension portions of the two rigid plates of the support plate structure.

14. The auxiliary apparatus according to claim 13, wherein the locking mechanism is U-shaped.

* * * * *